(12) United States Patent
Sohn et al.

(10) Patent No.: US 6,785,173 B2
(45) Date of Patent: Aug. 31, 2004

(54) SEMICONDUCTOR MEMORY DEVICE CAPABLE OF PERFORMING HIGH-FREQUENCY WAFER TEST OPERATION

(75) Inventors: Kwon-Il Sohn, Yongin (KR); Uk-Rae Cho, Suwon (KR); Kwang-Jin Lee, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/352,163

(22) Filed: Jan. 28, 2003

(65) Prior Publication Data

US 2003/0142566 A1 Jul. 31, 2003

(30) Foreign Application Priority Data

Jan. 30, 2002 (KR) .................................. 10-2002-0005422

(51) Int. Cl.[7] .............................. G11C 29/00; G11C 7/00
(52) U.S. Cl. ....................................... 365/201; 365/233
(58) Field of Search ....................... 365/189.01, 189.05, 365/189.07, 201, 233

(56) References Cited

U.S. PATENT DOCUMENTS

| | | | |
|---|---|---|---|
| 6,038,181 A | | 3/2000 | Braceras et al. ............ 365/201 |
| 6,111,807 A | * | 8/2000 | Ooishi .................... 365/230.01 |
| 6,259,647 B1 | * | 7/2001 | Ooishi .................... 365/230.01 |
| 6,385,125 B1 | * | 5/2002 | Ooishi et al. ................ 365/233 |
| 6,396,768 B2 | * | 5/2002 | Ooishi ......................... 365/233 |
| 2003/0112696 A1 | * | 6/2003 | Lee ............................. 365/233 |

* cited by examiner

Primary Examiner—VanThu Nguyen
(74) Attorney, Agent, or Firm—Harness Dickey

(57) ABSTRACT

A semiconductor memory device generates a test clock signal (whose periods and cycle number are variable) having a shorter cycle than that of an external clock signal, and internally test data using the test clock signal. The semiconductor memory device may repeatedly perform read/write operations using the internally generated test clock signal during a half cycle of the external clock signal. By comparing output data in the read operation with known data, a test apparatus may determine whether memory cells of a memory device are normal. In a low-frequency test apparatus, it is possible to screen disadvantages that may occur when a high-speed memory device operates at a high frequency.

28 Claims, 16 Drawing Sheets

SEMICONDUCTOR MEMORY DEVICE CAPABLE OF PERFORMING HIGH-FREQUENCY WAFER TEST OPERATION

RELATED APPLICATION

This application relies for priority upon Korean Patent Application No. 2002-0005422, filed on Jan. 30, 2002, the contents of which are herein incorporated by reference in their entirety.

FIELD OF THE INVENTION

The present invention relates to semiconductor integrated circuit devices and, more particularly, to a semiconductor memory device that internally generates a test clock signal having a shorter cycle than an external clock cycle and uses the test clock signal to apply a stress to components (e.g., memory cells) more efficiently.

BACKGROUND OF THE INVENTION

With the advance in CMOS integration circuit technologies, the integration level and operating speed of semiconductor devices has become very high. Thus, a wafer-level test apparatus should test semiconductor devices at a high frequency. However, since current wafer-level test apparatuses cannot support a high frequency or operating speed, technologies for performing a wafer test operation at a higher frequency have been required in order to test semiconductor devices (e.g., semiconductor memory devices) operating at a high frequency. There have been suggested technologies that internally generate an internal clock signal having a short cycle of an operation frequency for normal read and write operations to test semiconductor devices at a high frequency.

One such technology is disclosed in U.S. Pat. No. 6,038,181 entitled "EFFICIENT SEMICONDUCTOR BURN-IN CIRCUIT AND METHOD OF OPERATION", issued to George M. Braceras et. al. on Mar. 14, 2000. FIGS. 1 and 2 of the present application are substantially the same as FIGS. 3 and 4 of the '181 patent, where FIG. 1 is a block diagram of a conventional semiconductor memory device and FIG. 2 is a timing diagram of the semiconductor memory device shown in FIG. 1.

According to the conventional semiconductor memory device, a memory or logic device under test receives a clock that operates each device under test by way of a plurality of write and read operations during each power cycle. The conventional wafer-level test operation is described more fully in the '181 patent but need not be explained in further detail.

The above-mentioned semiconductor memory device suffers from several disadvantages as follows.

In order to generate an internal test clock signal, a dummy wordline and a dummy bitline must be formed in a memory cell array independently of usable wordlines and bitlines.

In order to calculate the number of cycles of the internal test clock signal, a counter 38 and a reset circuit 40 are additionally needed. Since the cycles of the internal test clock signal are constant, there is a limit on the number of cycles of an internal test clock signal generated during a high period of an external clock signal.

Further, the number of the cycles of the internal test clock signal must be set by a circuit, such as a JTAG test logic circuit 35 shown in FIG. 1 prior to the test operation.

In a write operation, data to be written in a memory cell array 12 must always be input external to the memory cell array 12.

Since a data verify method is used for each input/output pin after applying a stress to memory cells, each input/output pin needs a compare latching circuit 37. As a result, a chip size is increased.

Finally, if data read out from the memory cell array 12 at a first internal test clock cycle is in error, it is impossible to perform an accurate verify operation.

SUMMARY OF THE INVENTION

In an exemplary embodiment, the present invention provides a semiconductor device which internally generates an internal clock signal having an operation frequency with a short cycle for normal read and write operations to perform a test operation at a high frequency.

In an exemplary embodiment, the present invention provides a semiconductor memory device which more efficiently applies a stress to memory cells in a wafer test operation mode.

In an exemplary embodiment, the present invention provides a semiconductor memory device which writes data in memory cells during a wafer test operation mode without receiving external data.

In an exemplary embodiment, the present invention provides a semiconductor memory device which varies the number of cycles of an internal test clock signal.

In an exemplary embodiment, the present invention provides a semiconductor memory device which shortens a test time.

In an exemplary embodiment, the present invention provides a semiconductor memory device including a memory cell array, an address buffer circuit, a clock buffer circuit, a test clock generation circuit, a test clock control circuit, a writer circuit, a read circuit, a first pulse generation circuit, a second pulse generation circuit, and a comparator circuit.

The memory cell array stores data information. The address buffer circuit receives an external address in response to a test clock signal. The clock buffer circuit operates in response to a wafer test flag signal, and receives an external clock signal and generates a test period signal in a wafer test operation mode in response to the external clock signal. The test clock generation circuit generates a test clock signal in response to the test period signal. The test clock signal has a shorter period than that of the external clock signal during a half period of the external clock signal. The test clock control circuit determines whether the cycle number of the test clock signal is equal to the reference cycle number and allows the test clock generation circuit to stop generation of the test clock signal. The test clock control circuit generates test data to be written in the memory cell array. The write circuit writes the test data in an area of the memory cell array addressed by the input address in each cycle of the test clock signal. The read circuit reads the test data from the area of the memory cell array in each cycle of the test clock signal and outputs the read-out test data to data lines. The first latch pulse generation circuit generates first and second latch pulse signals in response to the external clock signal. The second latch pulse generation circuit generates a third latch pulse signal in response to a signal on one of the data lines. The comparator circuit operates in response to the first to third latch pulse signals, and determines whether data bits on the data lines have the same value and outputs a flag signal to an exterior as a determination result.

DESCRIPTION OF EXEMPLARY EMBODIMENTS

Figure 1:
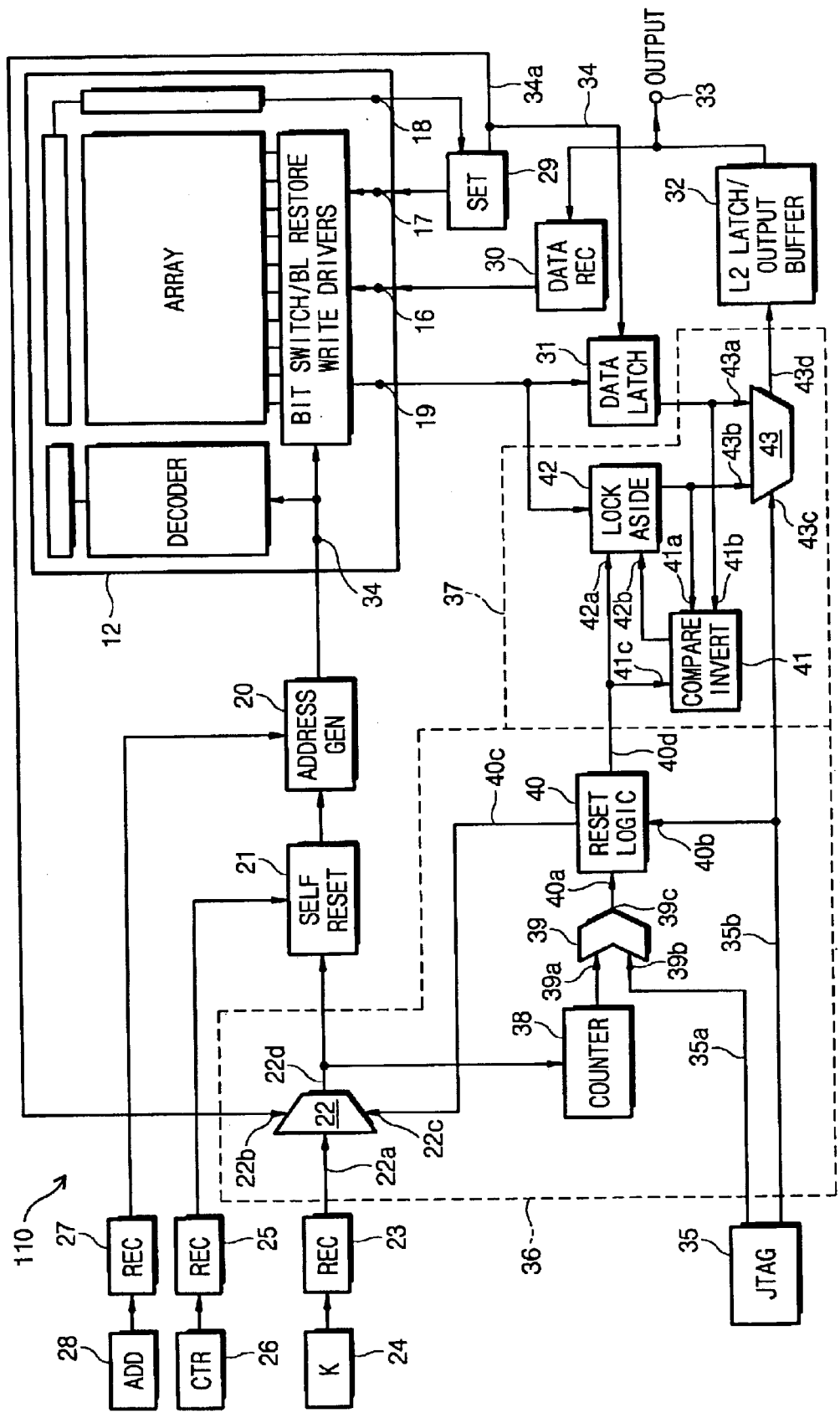
FIG. 1 is a block diagram of a conventional semiconductor memory device.
Figure 2:
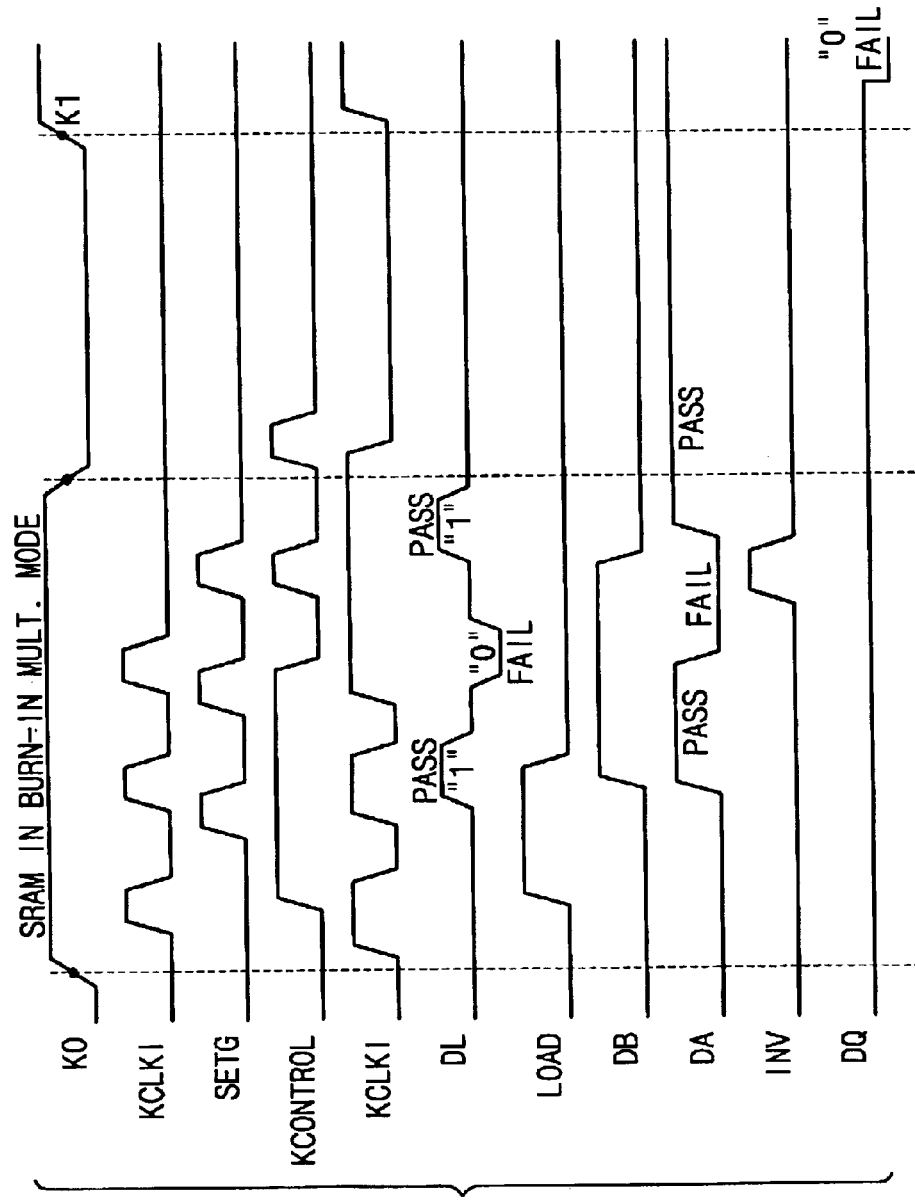
FIG. 2 is a timing diagram of the semiconductor memory device shown in FIG. 1.
Figure 3:
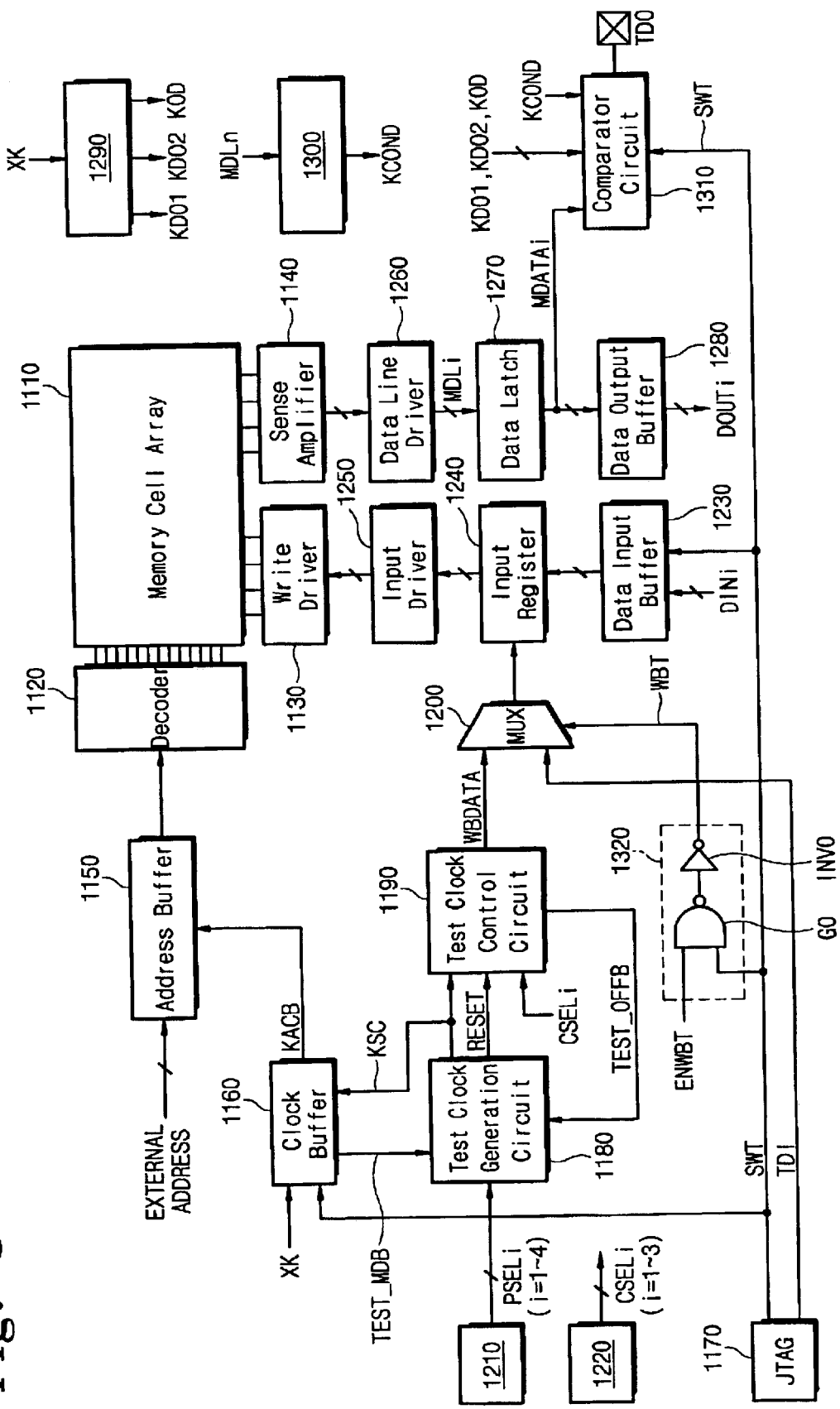
FIG. 3 is a block diagram of a semiconductor memory device according to an exemplary embodiment of the present invention.

Referring to FIG. 3, a semiconductor memory device according to the present invention includes a memory cell array 1110 for storing data information. In this exemplary embodiment, the semiconductor memory device is a static random access memory device. However, it will be understood that the invention may be applied to other types of random access memory devices, including dynamic random access memory devices. Although not shown in FIG. 3, the memory cell array 1110 includes a plurality of memory cells arranged in a matrix of rows and columns. The memory cells are selected through a decoder circuit 1120 according to an address provided from an address buffer circuit 1150. Data is written in the selected memory cells through a write driver circuit 1130, and is read out from the selected memory cells through a sense amplifier circuit 1140.

The address buffer circuit 1150 receives an external address in synchronization with a clock signal KACB outputted from a clock buffer circuit 1160, and provides the received address to the decoder circuit 1120. The clock buffer circuit 1160 operates in response to a test flag signal SWT outputted from a JTAG test logic circuit 1170. For example, when the test flag signal SWT is inactivated (or a normal operation is carried out), the clock buffer circuit 1160 outputs a KACB clock signal, synchronized with an external clock signal XK provided externally (e.g., from a memory controller), to the address buffer circuit 1150. In this case, the KACB clock signal has the same cycle as the external clock signal XK.

When the test flag signal SWT is activated (when a wafer test operation is to be carried out), the clock buffer circuit 1160 generates a test period signal TEST_MDB synchronized with the external clock signal XK provided externally (e.g., from a test apparatus). The test period signal TEST_MDB is an active low signal and has the same cycle as the external clock signal XK. That is, if the external clock signal XK has a low-to-high transition, the test period signal TEST_MDB has a high-to-low transition. On the other hand, if the external clock signal XK has a high-to-low transition, the test period signal TEST_MDB has a low-to-high transition.

The semiconductor memory device further includes a test clock generation circuit 1180, a test clock control circuit 1190, and a multiplexer 1200. The test clock generation circuit 1180 generates a test clock signal KSC in response to the test period signal TEST_MDB outputted from the clock buffer circuit 1160. For example, the test clock generation circuit 1180 starts generating the test clock signal KSC in response to the activation (e.g., high-to-low transition) of the test period signal TEST_MDB, and stops generating the test clock signal KSC in response to the inactivation (e.g., low-to-high transition) of the test period signal TEST_MDB.

In this exemplary embodiment, a cycle of the test clock signal KSC is shorter than that of the external clock signal XK. For example, the cycle of the test clock signal KSC is one of 2.5 ns, 5.0 ns, 7.5 ns, and 10 ns. Therefore, a test clock signal KSC having a plurality of clock cycles is formed during a half cycle (e.g., high period) of the external clock signal XK. The cycle of the test clock signal KSC may also be variable with data programmed in a first option circuit 1210, which is explained in more detail below.

The test clock signal KSC generated from the test clock generation circuit 1180 is transmitted to the clock buffer circuit 1160. In the wafer test operation mode, the clock buffer circuit 1160 delays the test clock signal KSC for a time and outputs a clock signal KACB, obtained by inverting the delayed clock signal, to the address buffer circuit 1150. The address buffer circuit 1150 receives an external address in synchronization with the clock signal KACB.

As can be seen in FIG. 3, the test clock signal KSC generated from the test clock generation circuit 1180 is also provided to a test clock control circuit 1190. The test clock control circuit 1190 generates test data in response to the test clock signal KSC. The test data is transferred to a data write circuit (which is explained in more detail below) through the multiplexer 1200. The test clock control circuit 1190 may also determine whether the cycle number of the test clock signal KSC reaches a given cycle number. If reached, the test clock control circuit 1190 activates a clock disable signal TEST_OFFB to disable the test clock generation circuit 1180 (i.e., to stop the generation of the test clock signal KSC). When the test period signal TEST_MDB is inactivated, the test clock generation circuit 1180 generates a reset pulse signal RESET. The test clock control circuit 1190 is reset by the reset pulse signal RESET.

In an exemplary embodiment, the given cycle number of the test clock control circuit 1190 may be variable. That is, the given cycle number of the test clock control circuit 1190 may be variable with data programmed in a second option circuit 1220, which is explained in more detail below.

Still referring to FIG. 3, the multiplexer 1200 receives test data WBDATA outputted from the test clock control circuit 1190 and data TDI inputted through the JTAG test logic circuit 1170. The multiplexer 1200 selects one of the input data in response to a selection signal WBT outputted from the selection signal generation circuit 1320. For example, when the selection signal is low, the multiplexer 1200 selects the data TDI outputted from the JTAG test logic circuit 1170. When the selection signal WBT is high, the multiplexer 1200 selects the test data WBDATA outputted from the test clock control circuit 1190.

The selection signal generation circuit 1320 may include a NAND gate G0 and an inverter INV0. A test flag signal SWT outputted from the JTAG test logic circuit 1170 is applied to one input terminal of the NAND gate G0 and a control signal ENWBT is applied to another input terminal thereof. The control signal ENWBT indicates whether the internally generated data is selected or data provided externally (i.e., JTAG test logic circuit) is selected. The control signal ENWBT may be externally provided or internally generated using an option circuit (not shown).

The semiconductor memory device further includes a data input buffer circuit 1230, an input register circuit 1240, an input driver circuit 1250, a data line driver circuit 1260, a data latch circuit 1270, and a data output buffer circuit 1280. The data input buffer circuit 1230 is controlled by the test flag signal SWT outputted from the JATG test logic circuit 1170. During a normal operation mode, the data input buffer circuit 1230 receives data bits DINi (i=0–m) inputted through input/output pins or input/output pads (not shown) and outputs the received data bits DINi to the input register circuit.

During a wafer test operation mode, the data input buffer circuit 1230 is disabled according to the test flag signal SWT from the JTAG test logic circuit 1170. The input register circuit 1240 latches an output of the multiplexer 1200 or an output of the data input buffer circuit 1230. The latched data is transferred to the write driver circuit 1130 through the input driver circuit 1250.

The data line driver circuit 1260 is responsive to data bits outputted from the sense amplifier circuit 1140 to drive corresponding data lines MDLi. The data latch circuit 1270 latches data bits on the data lines MDLi. The latched data is transferred externally through the data output buffer circuit 1280. Although not shown in FIG. 3, it is well known in the art that each data line (not shown) may comprise a pair of data lines so as to transfer complementary data signals.

In this exemplary embodiment, the write driver circuit 1130, the input register circuit 1240, and the input driver circuit 1250 constitute a data write circuit for writing data in a specific area of a memory cell array addressed by an address outputted from the address buffer circuit 1150. The sense amplifier 1140, the data line driver circuit 1260, and the data latch circuit 1270 constitute a data read circuit for reading data from a specific area thereof.

The semiconductor memory device further includes a first latch pulse generation circuit 1290, a second latch pulse generation circuit 1300, and a comparator circuit 1310. The first latch pulse generation circuit 1290 is responsive to the external clock signal XK to generate first and second pulse signals KDO1 and KDO2 and a delayed signal KOD of the external clock signal XK. The first latch pulse generation circuit 1290 generates a first latch pulse signal KDO1 in response to a low-to-high transition of the external clock signal XK and generates a second latch pulse signal KDO2 in response to a high-to-low transition of the external clock signal XK. Also the first latch pulse generation circuit 1290 delays and outputs the external clock signal XK. The delayed signal KOD is used as a precharge signal of the comparator circuit 1310, which will be explained in detail below. The second latch pulse generation circuit 1300 is coupled to one of the data lines MDLi and generates a third latch pulse signal KCOND in response to a transition of a signal on the data line.

The comparator circuit 1310 is coupled to an output of the data latch circuit 1270 and operates in response to the outputs KDO1, KDO2, KOD, and KCOND and the test flag signal SWT outputted from the JTAG test logic circuit 1170, as shown in FIG. 3. The comparator circuit 1310 determines whether data bits read-out at each cycle of the test clock signal KSC have the same value. Also the comparator circuit 1310 determines whether read-out data bits on a specific data line have the same value. Consequently, the comparator 1310 combines two kinds of determination results to externally output (e.g., to a test apparatus) a flag signal FLAG of a high level or a low level, through a test data output pad TDO. The comparator 1310 also outputs data read-out at a last cycle of an internal test clock through the test data output pad TDO when the next external clock is low.

Figure 4:
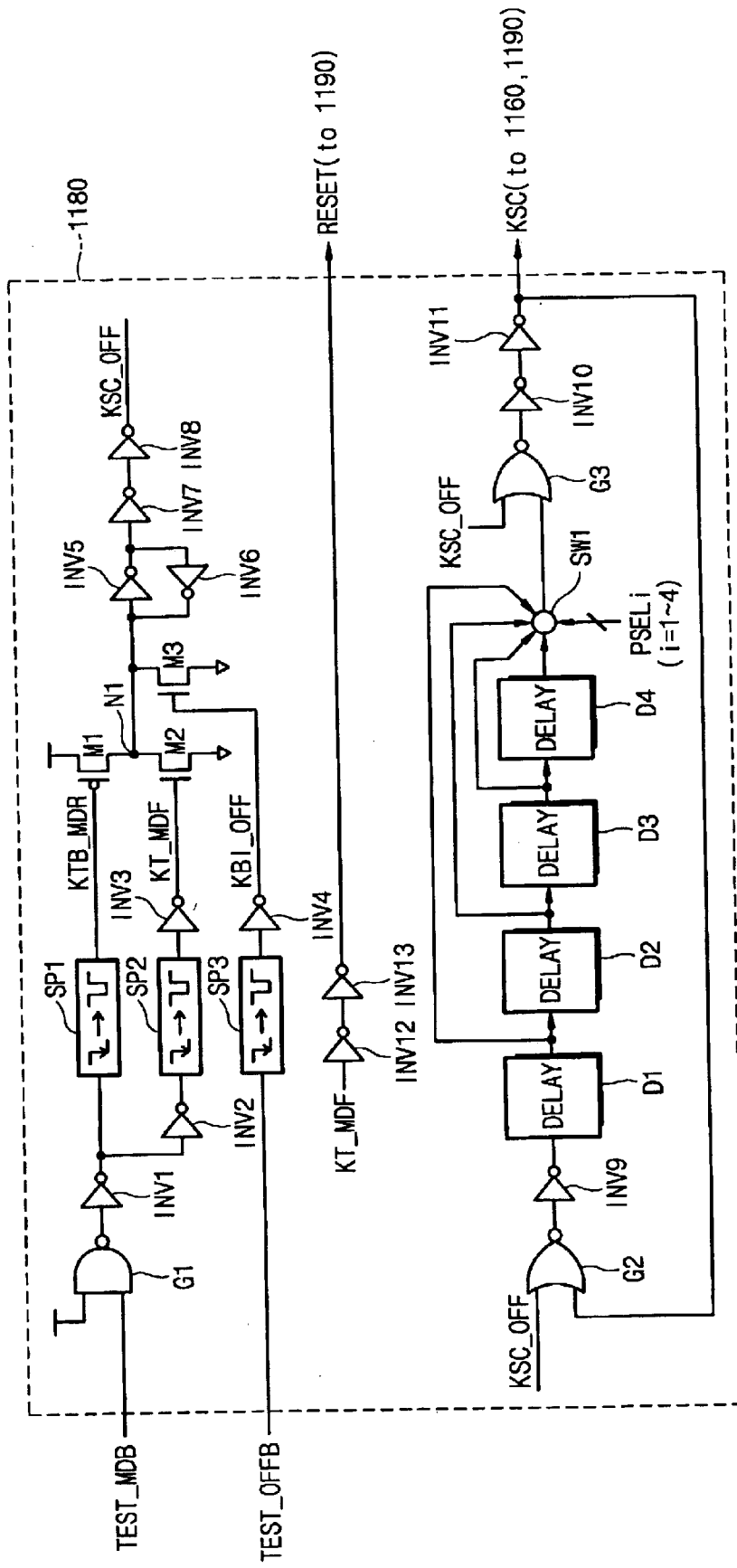
FIG. 4 is a circuit diagram showing an exemplary embodiment of a test clock generation circuit shown in FIG. 3.
Figure 5:
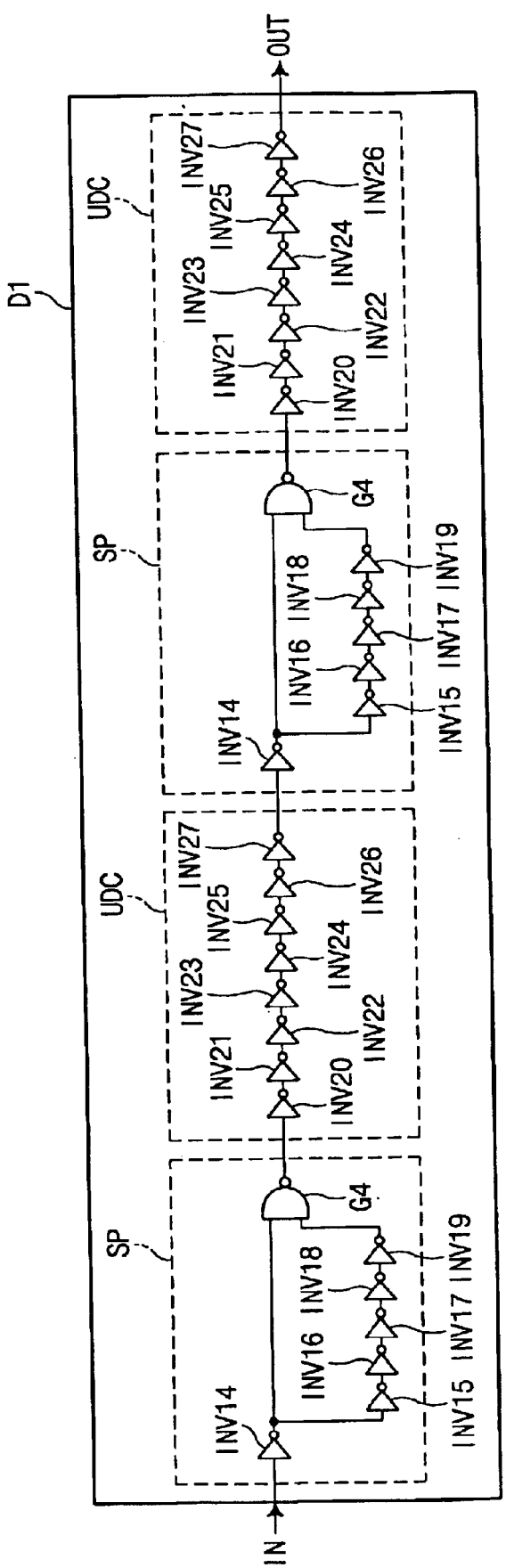
FIG. 5 is a circuit diagram showing an exemplary embodiment of a delay circuit shown in FIG. 4.

An exemplary embodiment of the test clock generation circuit 1180 shown in FIG. 3 is illustrated in FIG. 4. Referring to FIG. 4, the test clock generation circuit 1180 includes a NAND gate G1, NOR gates G2 and G3, inverters INV1–INV13, pulse generators SP1, SP2, and SP3, a PMOS transistor M1, NMOS transistors M2 and M3, delay elements D1–D4, and a selector SW1, which may be exemplarily connected as shown in FIG. 4. The NOR gates G2 and G3, the inverters INV9, INV10, and INV11, the delay elements D1–D4, and the selector SW1 may constitute a ring oscillator circuit. Each of the delay elements D1–D4 has two pulse generators SP and two unit delay components UDC, which may be connected as shown in FIGS. 4 and 5. The operation of the test clock generation circuit 1180 is described below.

Before the description thereof, it is assumed that a high level signal is latched to a latch comprising inverters INV5 and INV6 when a test period signal TEST_MDB is low. Under this assumption, an output KSC_OFF of the inverter INV8 becomes high, while the test clock signal KSC is kept low. When the test period signal TEST_MDB transitions from a high level to a low level, an output of the inverter INV1 transitions from a high level to a low level and the pulse generator SP1 generates a short pulse signal KTB_MDR. The PMOS transistor M1 is turned on by the short pulse signal KTB_MDR and a node N1 becomes high. Therefore, a low level signal is latched to the latches INV5 and INV6. As the low level signal KSC_OFF is applied to an input terminal of respective NOR gates G2 and G3, a test clock signal KSC having a defined cycle is generated through the delay elements D1–D4.

When the test clock signal KSC has generated the defined number of cycles, a clock disable signal EST_OFFB transitions from a high level to a low level. The pulse generator SP3 generates an active low pulse signal in response to a high-to-low transition of the clock disable signal TEST_OFFB. Thus, the NMOS transistor M3 is turned on to make the node N1 low. That is, the high level signal KSC_OFF is applied to one input terminal of the respective NOR gates G2 and G3 to stop generating the test clock signal KSC. Afterwards, when the test period signal TEST_MDB transitions from a low level to a high level (i.e., the external clock signal XK has a high-to-low transition), an output of the inverter INV2 transitions from a high level to a low level. Further, the pulse generator SP2 generates an active low pulse signal in response to a high-to-low transition of an input signal. The active low pulse signal outputted from the pulse generator SP2 is outputted as a reset signal RESET through the inverters INV3, INV12, and INV13. The reset signal RESET is used to reset the test clock control circuit 1190.

The cycle of the test clock signal KSC may be varied through the selector SW1. That is, the selector SW1 receives outputs of the delay elements D1–D4 and selects one of input signals in response to selection signals PSELi (i=1–4) from a first option circuit 1210. For example, the selector SW1 selects an output of the delay element D1 when the selection signal PSEL1 is activated, and selects an output of the delay element D2 when the selection signal PSEL2 is activated. The selector SW1 selects an output of the delay element D3 when the selection signal PSEL3 is activated, and selects an output of the delay element D4 when the selection signal PSEL4 is activated. If there are a small number of delay elements through which an output of the inverter INV9 passes, a cycle of the test clock signal KSC becomes shorter. If there are a large number of delay elements through which an output of the inverter INV9 passes, a cycle of the test clock signal KSC becomes longer. In this way, the test clock signal may have a variable cycle cycles, e.g., 2.5 ns, 5.0 ns, 7.5 ns, and 10 ns.

Figure 6:
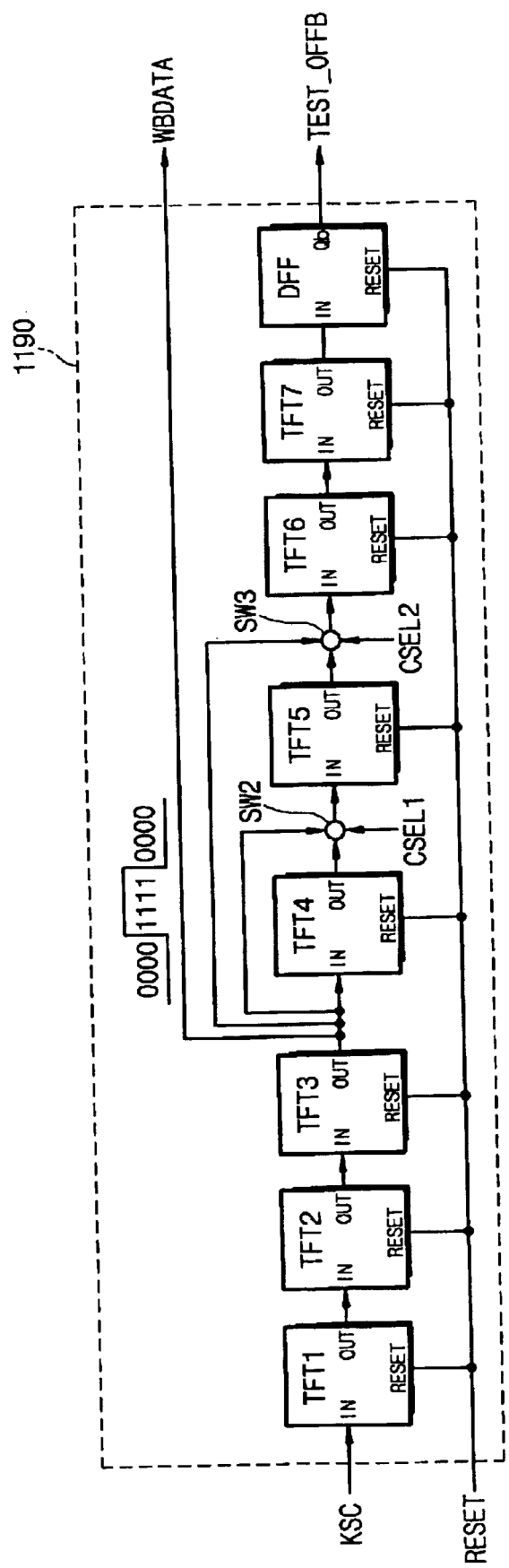
FIG. 6 is a circuit diagram showing an exemplary embodiment of the test clock generation circuit shown in FIG. 3.

FIG. 6 illustrates an exemplary embodiment of the test clock control circuit 1190 shown in FIG. 3. The test clock control circuit 1190 may include seven T flip-flops TFF1–TFF7, a D flip-flop DFF, and two selectors SW2 and SW3, which are connected as shown in FIG. 6. The T flip-flops TFF1–TFF7 and the D flip-flop DFF are reset by a reset signal RESET outputted from a test clock generation circuit 1180. The T flip-flops TFF1–TFF7 act as a divider for dividing a test clock signal KSC. The D flip-flop DFF outputs a clock disable signal TEST_OFFB which latches a low-to-high transition of an output of the T flip-flop TFF7 to have a high-to-low transition. The low-to-high transition of a signal outputted from the T flip-flop TFF7 means that a desired number of test clock signals KSC are generated.

The selector SW2 receives outputs of the T flip-flops TFF3 and TFF4 and selects one of input signals in response to a selection signal CSEL1 outputted from the second option circuit 1220 shown in FIG. 3. The selector SW3 receives outputs of the T flip-flops TFF3 and TFF5 and selects one of input signals in response to a selection signal CSEL2 outputted from the second option circuit 1220. As a result, by varying the number of T flip-flops through which the test clock signal KSC travels, the number of cycles of the test clock signal KSC to be detected is also varied.

Of the T flip-flops TFF1–TFF7 constituting a divider, an output of one flip-flop may be output as test data WBDATA used in a memory cell array 1110. This means that data to be used in the memory cell array 1110 may be internally generated without externally inputting any data. For this reason, it will be understood to a person skilled in the art that various test patterns may be produced.

Figure 7:
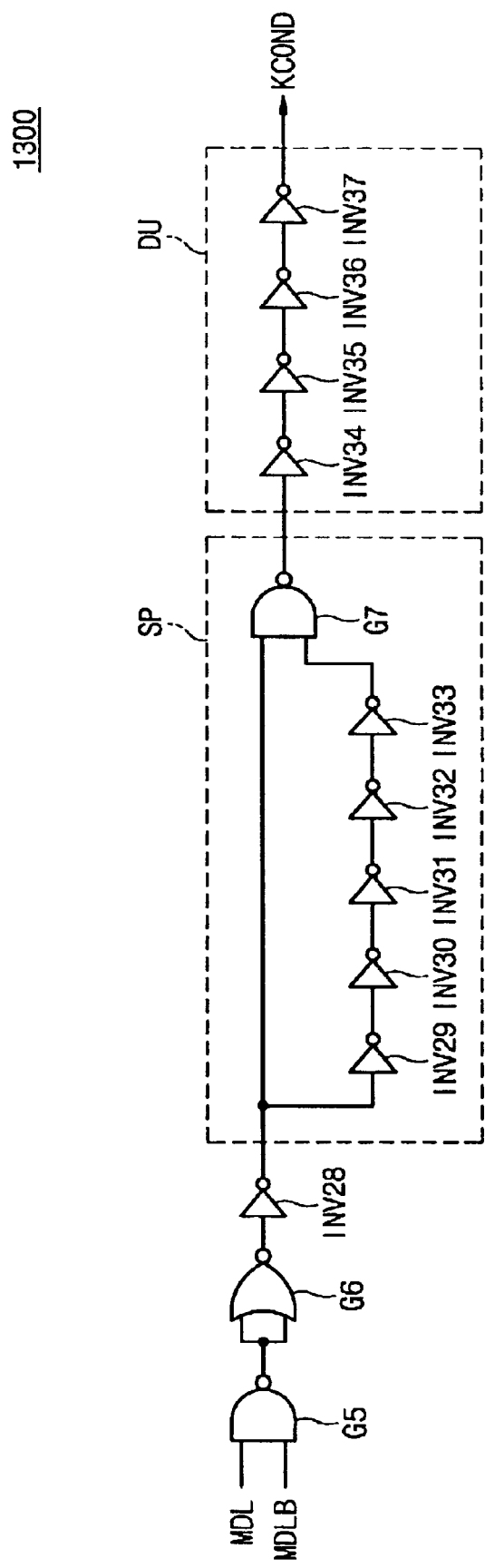
FIG. 7 is a circuit diagram showing an exemplary embodiment of a second latch pulse generation circuit shown in FIG. 3.

FIG. 7 illustrates an exemplary embodiment of the second latch pulse generation circuit 1300 shown in FIG. 3. The second latch pulse generation circuit 1300 may include a NAND gate G5, a NOR gate G6, an inverter INV28, a pulse generator SP, and a delay unit DU, which are exemplarily connected as shown in FIG. 7. The second latch pulse generation circuit 1300 may be coupled to one data line MDL1 among several data lines MDLn and its complementary data line MDLB1, and generates a third latch pulse signal KCOND in response to a signal transition on the data line MDL1.

Figure 8:
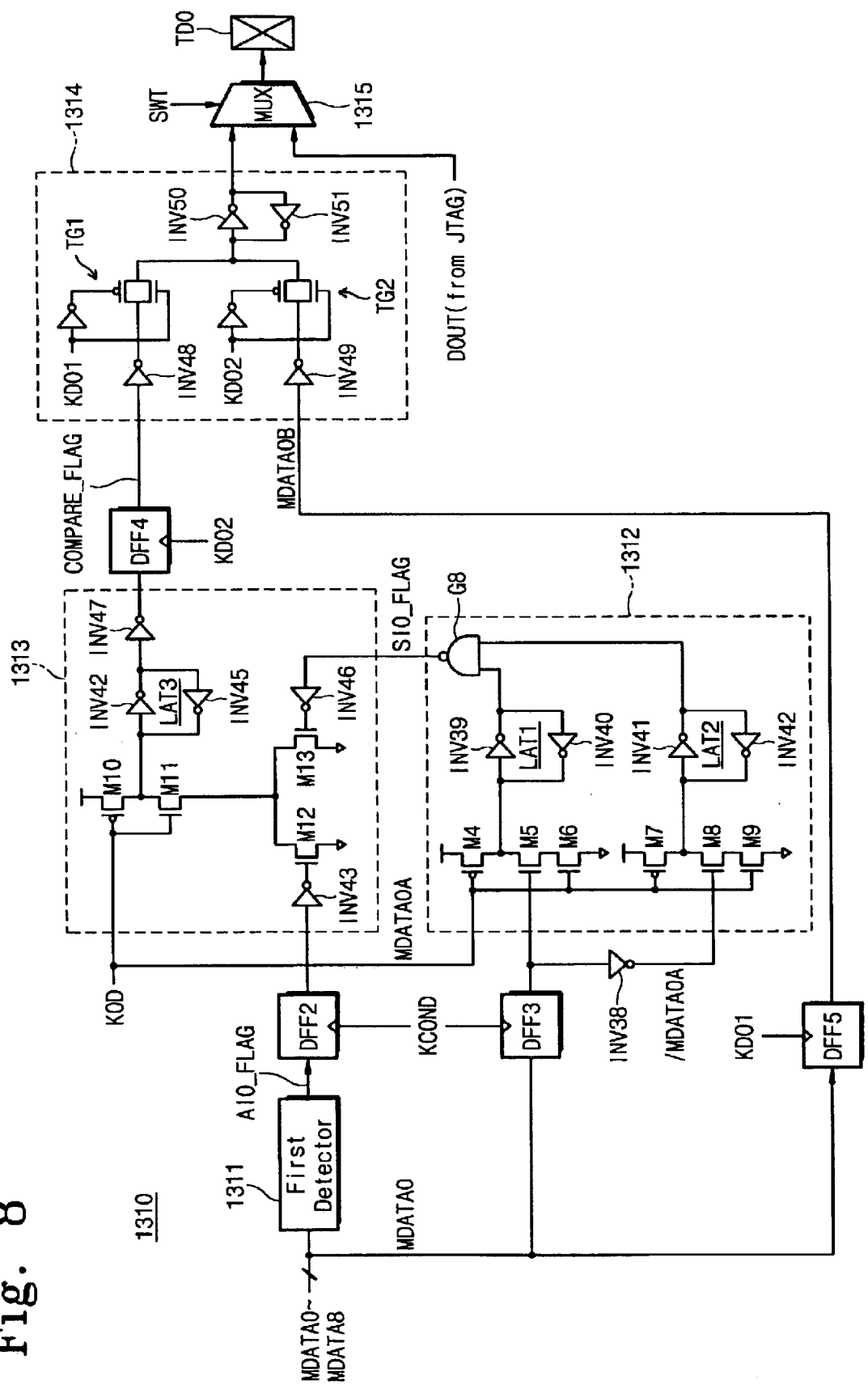
FIG. 8 illustrates an exemplary embodiment of a comparing circuit shown in FIG. 3.

FIG. 8 illustrates an exemplary embodiment of the comparator circuit 1310 shown in FIG. 3. The comparator 1310 includes first to third detectors 1311, 1312, and 1313, an output latch circuit 1314, D flip-flops DFF2, DFF3, DFF4, and DFF5, a multiplexer 1315, and an inverter INV38. The first detector 1311 receives data bits MDATAi (i=0–8) that are outputted from the data latch circuit 1270 in each cycle of the test clock signal KSC, and detects whether the inputted data bits MDATAi have the same value. The first detector 1311 outputs a first detection signal AIO_FLAG of a high or low level as the detection result. The data bits MDATAi inputted to the comparator circuit 1310 correspond to input/output pins (not shown), respectively.

Figure 9:
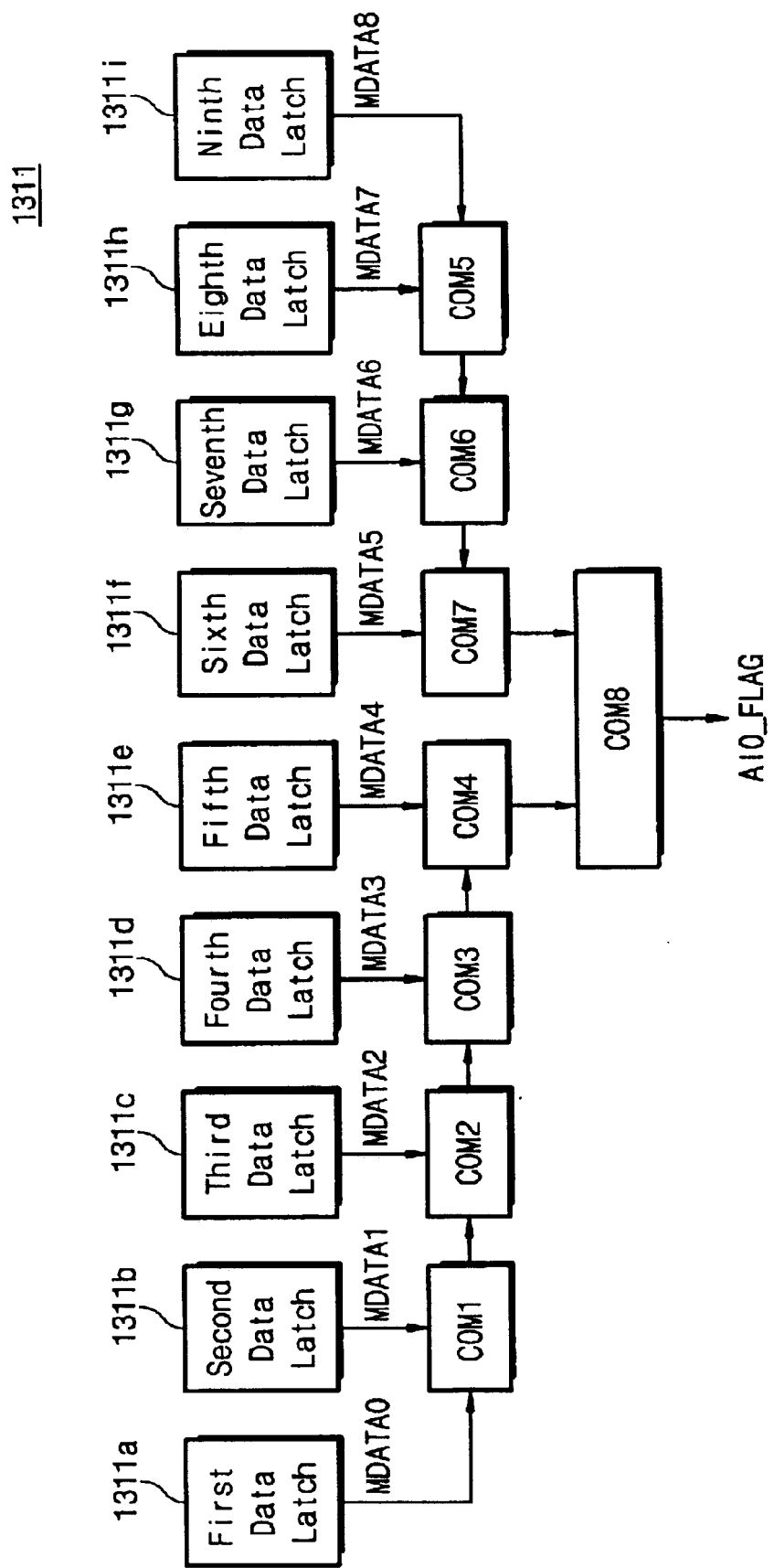
FIG. 9 illustrates an exemplary embodiment of a first detector shown in FIG. 8.

The first detector 1311 may have eight comparators COM1–COM8, which are connected as shown in FIG. 9. That is, each of the comparators COM1–COM8 compares two input values. Each of the comparators COM1–COM8 may be constructed using, for example, an exclusive-OR gate. When all the data bits MDATA0–MDATA8 have the same value or accessed memory cells are normal, the first detection signal AIO_FLAG becomes high. When at least one of the data bits MDATA1–MDATA8 has a different value from those of the other data bits or the accessed memory cells are abnormal, the first detection signal AIO_FLAG becomes low.

Returning to FIG. 8, the D flip-flop DF3 latches a specific bit (e.g., MDATA0) among the inputted data bits MDATA0–MDATA8 in response to a latch pulse signal KCOND from the second latch pulse generation circuit 1300, and transfers the latched data bit MDATA0 to the second detector 1312 via the inverter INV38. The second detector 1312 detects whether the data bit MDATA0 has the same value in each cycle of the test clock signal KSC, in response to an output MDATA0A of the D flip-flop DFF3 and an output /MDATA0A of the inverter INV38. The second detector 1312 outputs a second detection signal SIO_FLAG of a low or high level as the detection result. The second detection signal SIO_FLAG is transferred to the third detector 1313. The second detector 1312 includes PMOS transistors M4 and M7, NMOS transistors M5, M6, M8, and M9, inverters INV39–INV42, and a NAND gate G8, which are connected as shown in FIG. 8. The inverter couples (INV39, INV40) and (INV41, INV42) constitute latches LAT1 and LAT2, respectively. Each of the latches LAT1 and LAT2 are precharged through corresponding PMOS transistors M4 and M7 during a low period of the signal KOD.

The D flip-flop DFF2 latches the first detection signal AIO_FLAG outputted from the first detector 1311 in response to the third latch pulse signal KCOND, and transfers the latched signal AIO_FLAG to the third detector 1313. The third detector 1313 has a PMOS transistor M11, NMOS transistors M11–M13, and inverters INV43–INV47, which may be connected as shown in FIG. 8. The inverters INV44 and INV45 constitute a latch LAT3, which is precharged through the PMOS transistor M10 during a low period of the signal KOD. The third detector 1313 receives the first detection signal AIG_FLAG and the second detection signal SIO_FLAG, and detects whether even one of the inputted signals AIO_FLAG and SIO_FLAG has a low level. The low level of the input signal means that at least one (and maybe all) of the currently accessed memory cells is defective.

The D flip-flop DFF4 latches an output of the third detector 1313 in response to the second latch pulse signal KDO2, and latches the data bit MDATA0 on the specific data line in response to the first latch pulse signal KDO1. The output latch circuit 1314 latches an output of the D flip-flop DFF4 in response to the first latch pulse signal KDO, and latches an output of the D flip-flop DFF5 in response to the second output latch circuit KDO2. The output latch circuit 1314 may include inverters INV48–INV51 and transfer gates TG1 and TG2, which are connected as shown in FIG. 8. A flag signal FLAG latched to the output latch signal 1314 is outputted through the multiplexer 1315 controlled by the test flag signal SWT. The multiplexer 1315 may select DOUT from the JTAG test logic circuit 1170 in response to the test flag signal SWT. That is, in a test operation not the wafer test operation, the multiplexer selects the DOUT in response to the test flag signal SWT. The flag signal FLAG may be transferred to an external test apparatus (not shown) connected to the test output pad TDO during a high period of the next external clock signal. Compared data is transferred to the external test apparatus connected to the test output pad TDO during a low period of the next external clock signal.

Figure 10A:
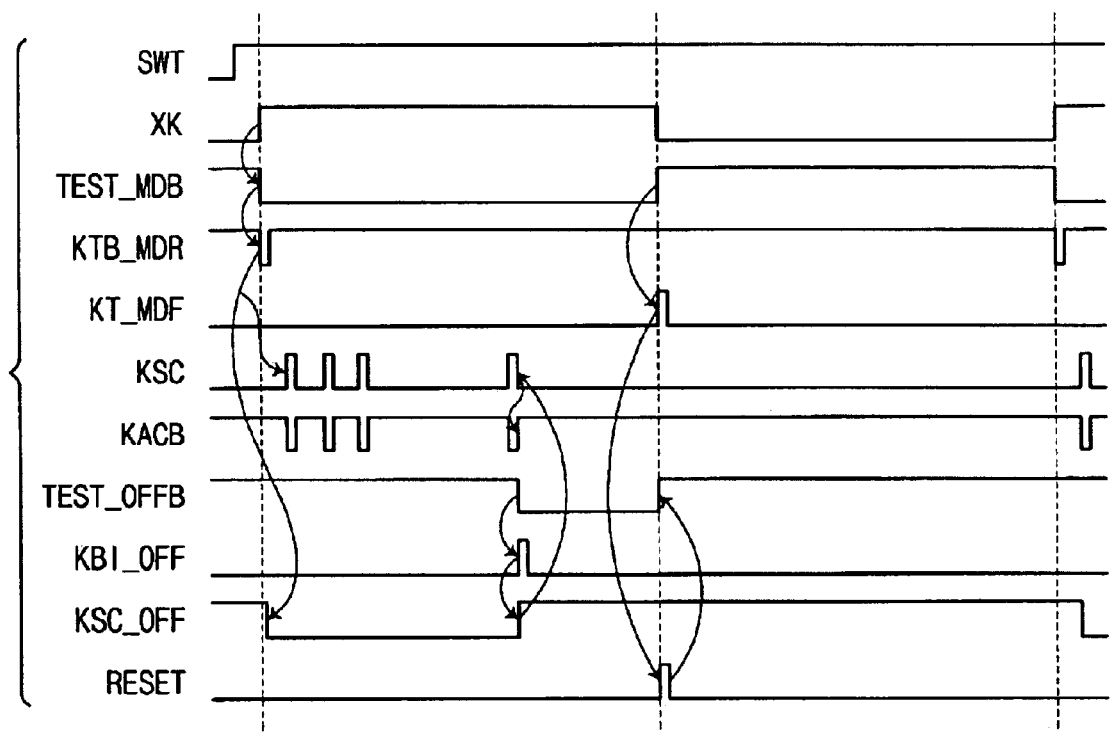
FIG. 10A and FIG. 10B are timing diagrams of the semiconductor memory device according to an exemplary embodiment of the present invention.

The test read/write operations of the semiconductor memory device according to exemplary embodiments of the present invention will now be described more fully with reference to the timing diagrams of FIG. 10A and FIG. 10B.

In a wafer test operation mode, internally generated data or data externally received through JTAG 1170 is repeatedly written in a memory cell array in each cycle of a test clock signal KSC during the test write operation. The written data is repeatedly read out in each cycle of the test clock signal KSC during the test read operation. Since the data is written and read out according to a short-cycle test clock signal that is internally generated during a half cycle of the external clock signal KSC, memory cells are subjected to a relatively heavy stress during the same test time. Next, the wafer test operation is described using the internally generated write data.

The semiconductor memory device enters the wafer test operation mode, which is achieved by making the JTAG test logic circuit 1170 activate a test flag signal SWT high. While an external clock signal XK having a given cycle (e.g., 200 ns) is kept high, a test clock signal KSC is generated which has a shorter cycle than that of the external clock signal XK. The test write operation is performed in synchronization with the test clock signal KSC. The test write operation is explained in detail below.

As the external clock signal XK transitions from a low level to a high level, a clock buffer circuit 1160 activates a test period signal TEST_MDB synchronized with the external clock signal XK. The pulse generator SP1 of the test clock generation circuit 1180 generates an active-low pulse signal KTB_MDR as the test period signal TEST_MDB is activated. This makes input signals KSC_OFF of the NOR gates G2 and G3 have a low level. As a result, a ring oscillator in the test clock generation circuit 1180 operates to start generating a test clock signal KSC.

The generated test clock signal KSC is transferred to the address buffer circuit 1150 through the clock buffer circuit 1160 and simultaneously transferred to a test clock generation circuit 1190. The address buffer circuit 1150 receives an external address in synchronization with a clock signal KACB transferred through the clock buffer circuit 1160, and transfers the received address to the decoder circuit 1120. The test clock generation circuit 1190 generates test data WBDATA in response to the test clock signal KSC. For example, in a case where an output of the third T flip-flop TFF3 of the test clock generation circuit 1190 is outputted as the test data WBDATA, the test data WBDATA has a pattern such as "00001111". Each bit value of the test data WBDATA is kept during one cycle of the test clock signal KSC.

The generated test data WBDATA is transferred to an input register circuit 1240 through a multiplexer 2000. An input register circuit 1240 transfers the inputted test data to a write driver circuit 1130 through an input driver 1250. The test data then may be written in a specific area of the memory cell array that is addressed according to an address outputted from the address buffer circuit 1150 in a conventional manner. In each cycle of the test clock signal KSC, the test data may be written in the specific area.

The test clock control circuit 1190 checks whether the desired number of test clock signals KSC has been generated. If so, the test clock control circuit 1190 activates a clock disable signal TEST_OFFB low. With a high-to-low transition of the clock disable signal TEST_OFFB, a node N1 of the test clock generation circuit 1180 is connected to a ground voltage through the NMOS transistor M3. This make input signals of the NOR gates G2 and G3 have a high level. As a result, the test clock generation circuit 1180 stops generating the test clock signal KSC.

With a high-to-low transition of the external clock signal XK, the test period signal TEST_OFFB is inactivated high. With a low-to-high transition of the test period signal TEST_OFFB, an output of the inverter INV2 in the test clock generation circuit 1180 transitions from a high level to a low level. The pulse generator SP2 in the test clock generation circuit 1180 generates an active-low pulse signal in response to a high-to-low transition of an input signal. The active-low pulse signal outputted from the pulse generator SP2 is outputted as a reset signal RESET through the inverters INV3, INV12, and INV13. The test clock control circuit 1190 may be reset by the reset signal RESET.

As described above, the test write operation is repeated for each cycle number of the test clock signal KSC. When the external clock signal XK becomes low, the semiconductor memory device goes into a stand-by mode. When the external clock signal becomes high again, the test write or read operation may be performed. The test write operation may be performed substantially the same as described above, while the test read operation may be performed as follows.

When the external clock signal XK transitions from a low level to a high level again, a test clock signal KSC is generated which has a shorter cycle than that of the external clock signal XK. In synchronization with the test clock signal KSC, the test read operation may be performed. The read operation is explained in detail below.

Figure 10B:
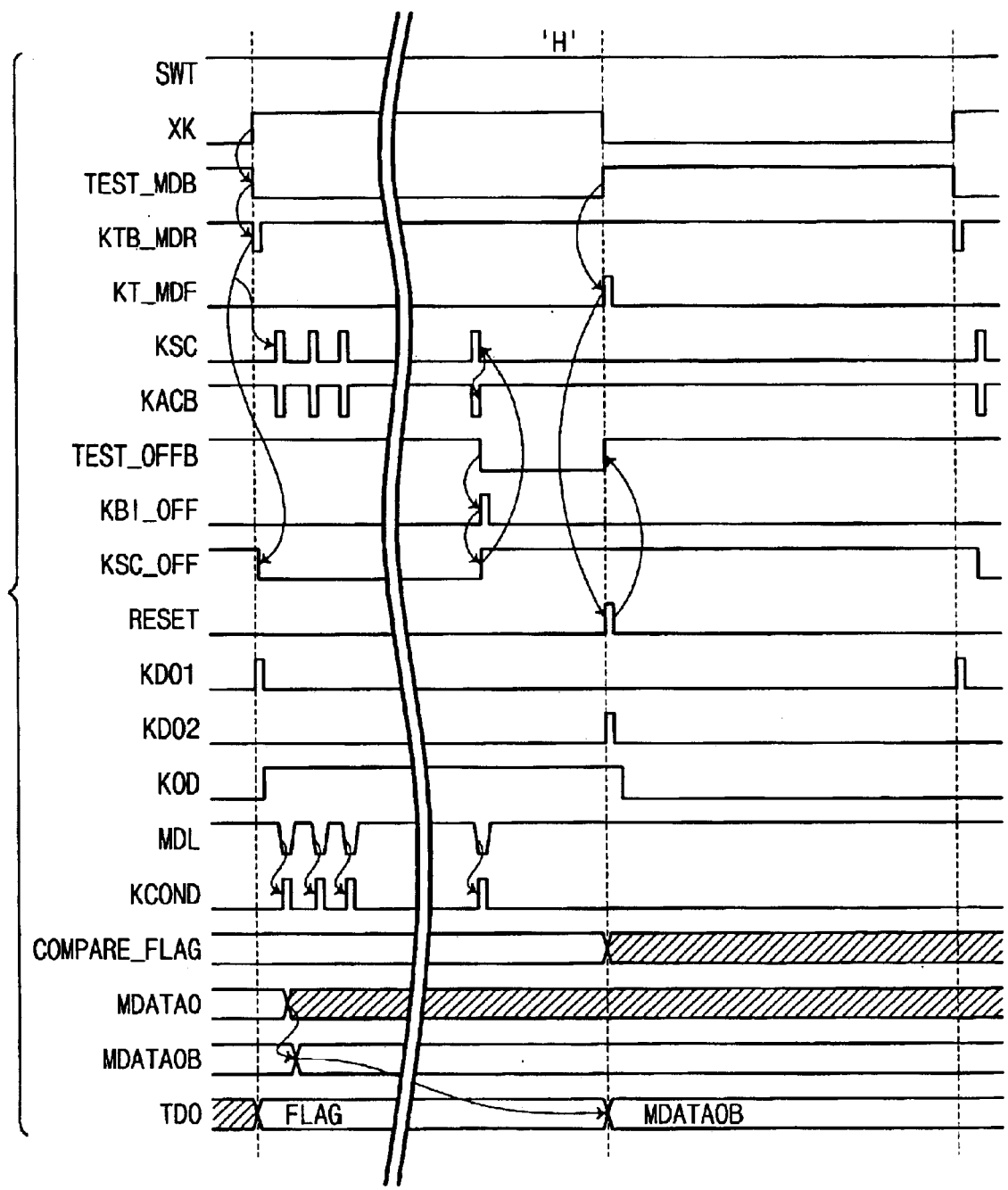

As shown in FIG. 10B, prior to a low-to-high transition of the external clock signal XK, a KOD signal (or precharge signal) is kept low. As the PMOS transistors M4, M7, and M10 in the comparator circuit 1310 are turned on by the KOD signal at a low level, the latches LAT1, LAT2, and LAT3 of the comparator circuit 1310 are initialized low. That is, the detection signals AIO_FLAG and SIO_FLAG become high.

As the external clock signal XK transitions from a low level to a high level, the clock buffer circuit 1160 activates a test period signal TEST_MDB synchronized with the external clock signal XK. The pulse generator SP1 of the test clock generation circuit 1180 generates an active-low pulse signal KTB_MDR as the test period signal TEST_MDB is activated. This makes input signals KSC_OFF of the NOR gates G2 and G3 have a low level. As a result, a ring oscillator in the test clock generation circuit 1180 operates to generate a test clock signal KSC.

The generated test clock signal KSC is transferred to the address buffer circuit 1150 through the clock buffer circuit 1160, and transferred to the test clock control circuit 1190. The address buffer circuit 1150 receives an external address in synchronization with a clock signal KACB transferred through the clock buffer circuit 1160, and transfers the received address to the decoder circuit 1120. The sense amplifier circuit 1140 reads data from a specific area of the memory cell array 1110 addressed by the decoder circuit 1120. The read-out data bits are transferred to data lines MDLi (i=0–8) through a data line driver circuit 1260. A data latch circuit 1270 latches the data bits on the data lines MDLi.

During the test read operation, the data bits latched in the data latch circuit 1270 are transferred to the comparator circuit 1310. A first detector 1311 of the comparator circuit 1310 detects whether the inputted data bits have the same value. For example, if the inputted data bits have the same value, the first detector 1311 outputs a first detection signal AIO_FLAG of a high level. The outputted first detection signal AIO_FLAG is latched to a D flip-flop DFF2 in synchronization with a latch pulse signal KCOND. The latched first detection signal AIO_FLAG is transferred to a third detector 1313.

The latch pulse signal KCOND is generated in each cycle of the test clock signal KSC in synchronization with a signal transition on a specific data line MDL, as shown in FIG. 10B.

The D flip-flop DFF3 is synchronized with the latch pulse signal KCOND and latches a data bit MDATAO corresponding to a specific data line among the inputted data bits MDATAi. The latched data bit MDATAO is transferred to the second detector 1312 directly and through the inverter INV38. In response to inputted signals MDATAOA and /MDATAOA, the second detector 1312 detects whether the data bits MDATAO on the specific data line have the same value as the data bit accessed in a previous cycle of the test clock signal KSC. For example, it is assumed that the data bit MDATA0 accessed in the previous cycle is "0"and the data bit MDATA0 accessed in the next cycle is "1".

Under this assumption, because the data bits MDATA0 accessed in the previous cycle is "0", one input of the NAND gate G8 becomes low and another input thereof becomes high. Thus, the second detection signal SIO_FLAG is kept high. If the data bit MDATAO accessed in the next cycle is "0", input signals of the second detection signal SIO_FLAG are kept at previous logic states. That is, if the data bit MDATAO accessed in the next cycle is "0", the second detection signal SIO_FLAG is kept high. If the data bits MDATAO accessed in the next cycle is "1", input signals of the second detection signal SIO_FLAG all become high. This leads to a high-to-low transition of the second detection signal SIO_FLAG.

The result detected by the first detector 1311 and the result detected by the second detector 1312 are concurrently applied to the third detector 1313. The third detector 1313 detects whether at least one of the inputted signals AIO_FLAG and SIO_FLAG has a low level. The fact that an input signal has a low level means currently accessed memory cells are defective. The above-mentioned sensing and detecting procedures may be repeatedly performed in each cycle of the test clock signal KSC. As a result, the final results of test read operations, which are repeatedly performed in an activation period of the test period signal TEST_MDB or a high period of the external clock signal XK, are temporarily stored in the third detector 1313.

As shown in FIG. 10B, when the external clock signal XK transitions from a low level to a high level, a first latch pulse signal KDO1 is generated from the first latch pulse generation circuit 1290. This allows the D flip-flop DFF5 to latch a data bit (e.g., MDATA0) on a specific data line. In this case, the data latched to the D flip-flop DFF5 is a data bit that is finally accessed in a previous cycle. When the first latch pulse signal KDO1 is generated, the output latch circuit 1314 latches an output of the D flip-flop DFF4 operating in synchronization with a second latch pulse signal KDO2. This is explained in detail below.

A data bit, which is finally accessed in an (N−1)th cycle of the external clock signal XK, is latched to the D flip-flop DFF5 in synchronization with the first latch pulse signal KDO1 at an Nth cycle of the external clock signal XK or when an external clock signal XK of the Nth cycle has a low-to-high transition. As a test result of the (N−1)th cycle, an output of the D flip-flop DFF4 is transferred to a test data output pad TI)O through an output latch circuit 1314 in synchronization with the first latch pulse signal KDO1 at the Nth cycle of the external clock signal XK or when the external clock signal of the Nth cycle has a low-to-high transition. A signal COMPARE_FLAG, which indicates a result of the test read operation performed in the Nth cycle of the external clock signal XK, is latched to the D flip-flop DFF4 in synchronization with the second latch pulse signal KDO2 when the external clock signal XK of the Nth cycle transitions from a high level to a low level (or when the second latch pulse signal KDO2 is generated). An output of the D flip-flop DFF5 is data bit that corresponds to a specific data line and is one of the data bits finally accessed in the (N−1)th cycle of the external clock signal XK. When the external cock signal of the Nth cycle transitions from a high level to a low level or when the second latch pulse signal KDO2 is generated, the output of the D flip-flop DFF5 is transferred to the test data output pad TDO through the output latch circuit 1314 in synchronization with the second latch pulse signal.

When the first latch pulse signal KDO1 is generated in the Nth cycle of the external clock signal XK, the result FLAG of the test read operation performed in the (N−1)th cycle is transferred to the test data output pad TDO through the multiplexer 1315. In addition, when the second latch pulse signal KDO2 is generated in the Nth cycle of the external clock signal XK, the data bit finally accessed in the (N−1)th cycle of the external clock signal is transferred to the test data output pad TDO through the multiplexer 1315.

TABLE 1

| FLAG | MDATAOB | Detection Result |
|---|---|---|
| 0 | 0 | FAIL |
|   | 1 | FAIL |
| 1 | 0 | PASS (when stored data is "0") |
|   | 1 | PASS (when stored data is "1") |

TABLE 1 shows results that are determined externally. The test results are determined according to the FLAG value outputted during a high period of an external and the MDATAOB value outputted during a low period of the external clock signal. For example, when the FLAG value is high and read-out data in the memory matches expected data, a corresponding memory cell is determined to be good.

The test clock control circuit 1190 may also determine whether the test clock signal KSC has been generated for the desired number of cycles. If so, the test clock control circuit 1190 activates a clock disable signal TEST$_{13}$ OFFB low.

With a high-to-low transition of the clock disable signal TEST_OFFB, a node N1 of the test clock generation circuit 1180 is coupled to a ground voltage through an NMOS transistor M3. This makes input signals of the NOR gates G2 and G3 have a high level. As a result, the test clock generation circuit 1180 stops generating the test clock signal KSC.

As the external clock signal XK transitions from a high level to a low level, the test period signal TEST_OFFB is inactivated high. With a low-to-high transition of the test period signal TEST_OFFB, an output of the inverter INV2 in the test clock generation circuit 1180 transitions from a high level to a low level. A pulse generator SP2 in the test clock generation circuit 1180 generates an active-low pulse signal in response to a high-to-low transition of an input signal. The active-low pulse signal outputted from the pulse generator SP2 is outputted through inverters INV3, INV12, and INV13 as a reset signal RESET. The test clock control circuit 1190 is reset by the reset signal RESET.

As described above, during a high period of the external clock signal XK, the test read operation is as repeated for each cycle of the test clock signal KSC. When the external clock signal XK becomes low, the semiconductor memory device goes into a stand-by mode. When the external clock signal becomes high again, the test write or read operation may be performed. The test write/read operations may be performed substantially the same as described above.

In exemplary embodiments, when the external clock signal XK transitions from a high level to a low level, the test period signal TEST_MDB transitions from a low level to a high level. This enables the pulse generator SP2 to operate. As a result, an oscillator of the test clock generation circuit 1180 does not operate and the test clock control circuit 1190 is initialized by the reset signal RESET.

Figure 11:
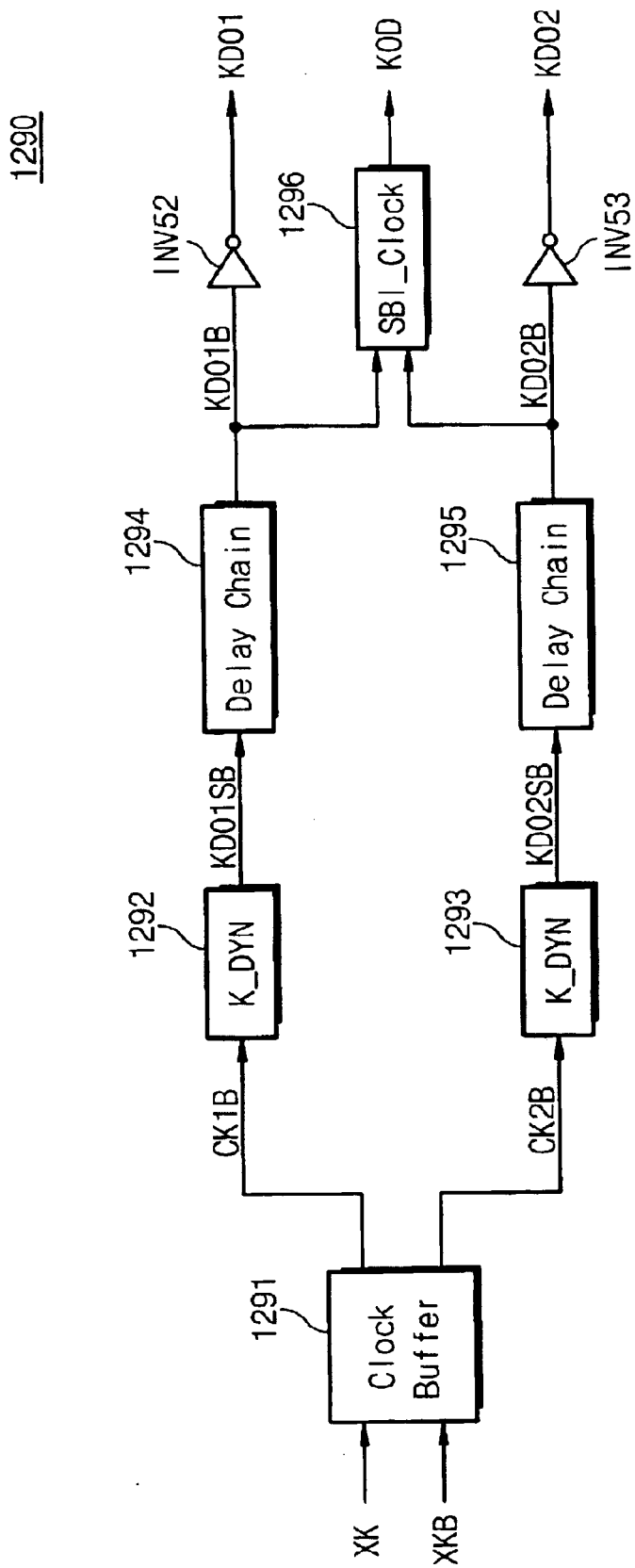
FIG. 11 is a circuit diagram showing an exemplary embodiment of a first latch pulse generation circuit shown in FIG. 3.

FIG. 11 illustrates an exemplary embodiment of the first latch pulse generation circuit 1290 shown in FIG. 3. The first latch pulse generation circuit 1290 receives the external clock signal XK and its compliment XKB to generate first and second pulse signals KDO1 and KDO2 and a delayed signal KOD of the external clock signal XK. The first latch pulse generation circuit 1290 generates a first latch pulse signal KDO1 in response to a low-to-high transition of the external clock signal XK and generates a second latch pulse signal KDO2 in response to a high-to-low transition of the external clock signal XK. The first latch pulse generation circuit 1290 also delays an outputs via external clock signal XK as delayed signal KOD. The delayed signal KOD is used as a pre-charge signal of the comparator circuit 1310, as explained above.

The first latch pulse generation circuit 1290 may include a clock buffer 1291, two or more K_DYN circuits 1292, 1293, at least two delay chain circuits 1294, 1295, at least two inverters, INV52, INV53, and an SBI_Clock circuit 1296, which are exemplarily connected as shown in FIG. 11. FIGS. 12–15 illustrate various exemplary circuits that make up the first latch pulse generation circuit 1290 and FIG. 16 is a timing diagram of the first latch pulse generation circuit 1290 according to an exemplary embodiment of the present invention.

Figure 12:
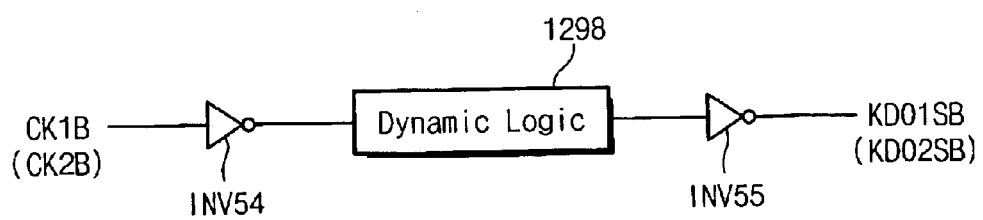
FIG. 12 is a circuit diagram showing an exemplary embodiment of a K_DYN circuit shown in FIG. 11.

FIG. 12 is a circuit diagram showing an exemplary embodiment of the K-DYN circuit 1292, 1293 shown in FIG. 11. The clock buffer 1291 receives the external clock signal XK and its compliment XKB and produces clock signals CK1B and CK2B, as illustrated in FIG. 16. The K-DYN circuits 1292, 1293 receive one of the output signals of the clock buffer 1291, for example CK1B or CK2B and produce one of clock signals KDO1SB and KDO2SB, as shown in FIG. 16. Each K-DYN circuit 1292, 1293 includes an inverter INV54, a dynamic logic circuit 1298 (which is discussed in more detail below) and an inverter INV55.

Figure 13:
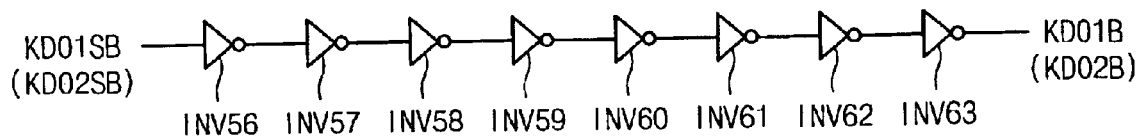
FIG. 13 is a circuit diagram showing an exemplary embodiment of a delay chain circuit shown in FIG. 11.

FIG. 13 is a circuit diagram showing an exemplary embodiment of the delay chain circuit 1294, 1295 shown in FIG. 11. Each delay chain circuit 1294, 1295 receives either the KDO1SB output from K_DYN circuit 1292 or the KDO2SB signal output from K_DYN circuit 1293 and produces either a KDO1B output signal or KDO2B output signal, as shown in FIG. 16. Each delay chain circuit 1294, 1295 includes a series of inverters, for example, inverters INV56–INV63 (eight inverters being merely an exemplary number), as illustrated in FIG. 13.

Figure 14:
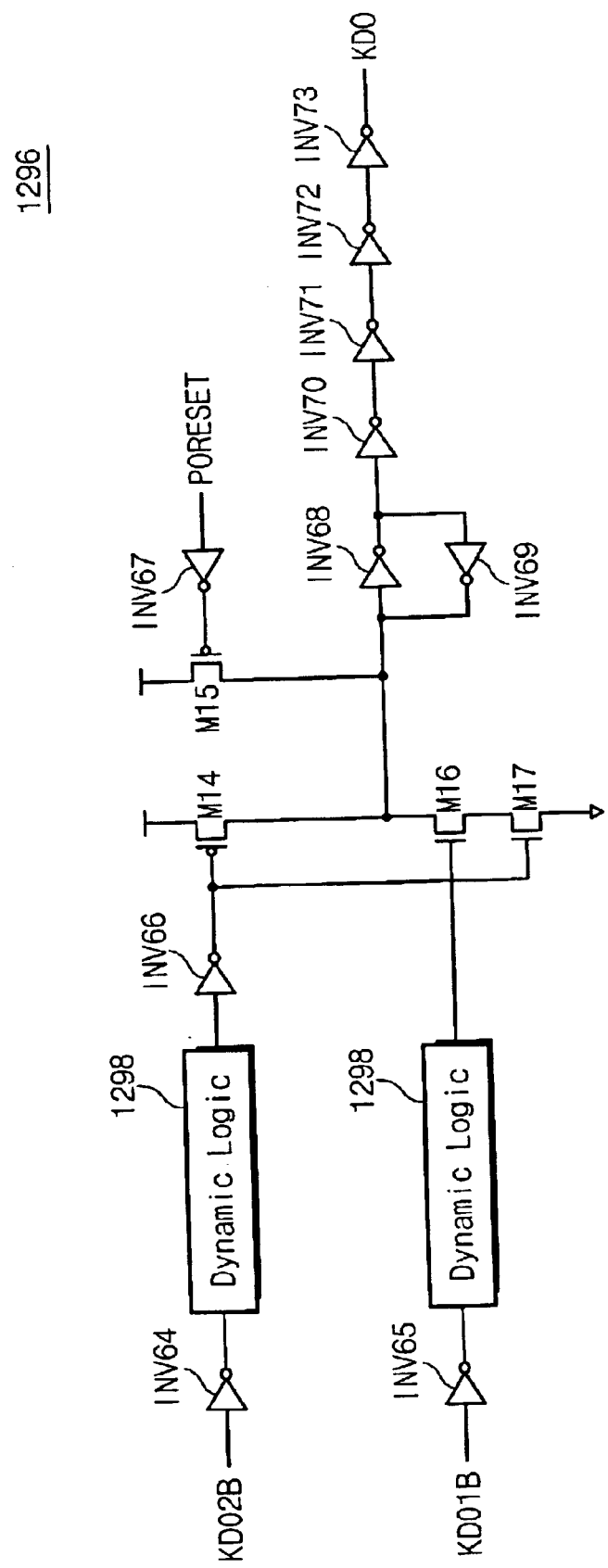
FIG. 14 is a circuit diagram showing an exemplary embodiment of the SBI_clock circuit shown in FIG. 11.

FIG. 14 is a circuit diagram showing an exemplary embodiment of SBI_Clock circuit 1296 of FIG. 11. The SBI_Clock circuit 1296 receives the KDO1B signal from the delay chain circuit 1294 and the KDO2B signal from the delay chain circuit 1295, and a reset signal PORESET, and produces the delayed signal KOD of the external clock signal XK, as shown in FIG. 16. In more detail, as shown in FIG. 14, the SBI_clock 1296 signal includes a pair of inverters INV64–INV65 and a pair of dynamic logic circuits 1298 each of which receives one of the KDO1B and the KDO2B signals from the delay chain circuits 1294, 1295 respectively. The SBI_clock circuit 1296 also receives a PORESET signal, as illustrated in FIG. 16 and produces the delayed signal KOD of the external clock signal XK as shown in FIG. 14. As shown in FIG. 14, the SBI_clock circuit 1296 includes a plurality of transistors Mn, a plurality of inverters INVm, and at least two dynamic logic circuits 1298.

Figure 15:
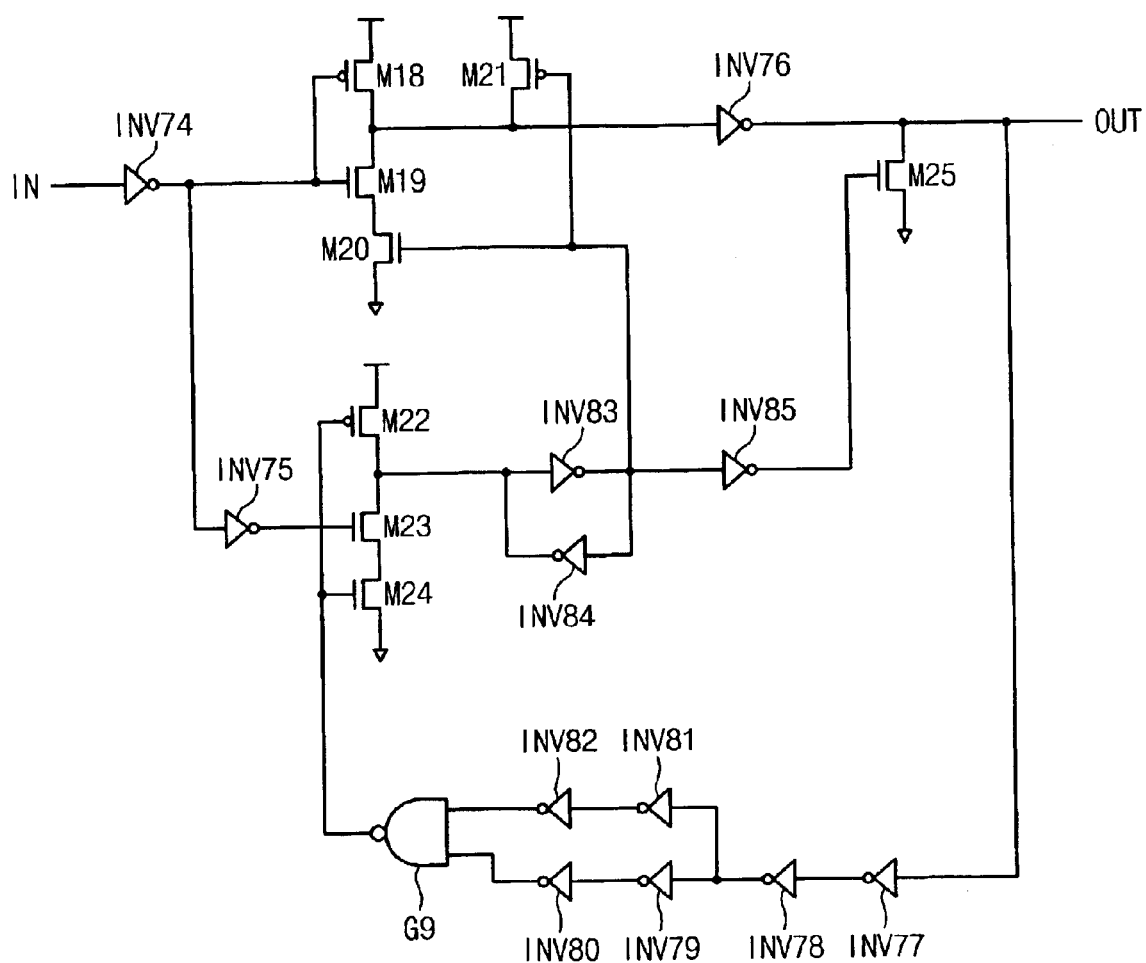
FIG. 15 is a circuit diagram showing an exemplary embodiment of the dynamic logic circuit of FIGS. 12 and/or 14.
Figure 16:
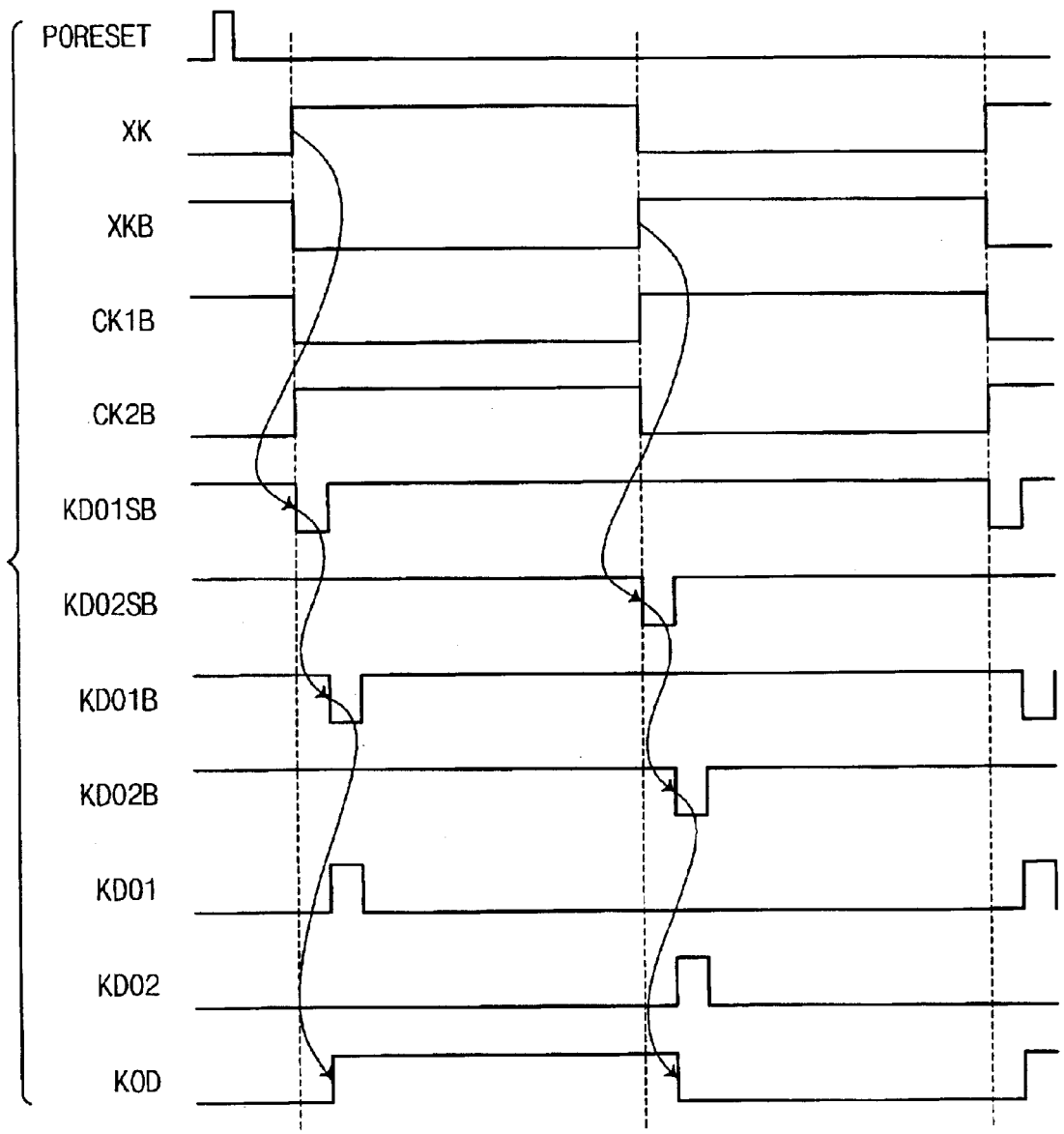
FIG. 16 is a timing diagram of the first latch pulse generating circuit of FIG. 11 according to an exemplary embodiment of the present invention.

FIG. 15 is a circuit diagram showing an exemplary embodiment of the dynamic logic circuit 1298 of FIG. 14. The dynamic logic 1298 receives an output of one of the inverters INV64 and INV65 as an input signal IN and produces an output signal OUT, which is supplied to the inverter INV66 of FIG. 14, utilizing the exemplary circuitry illustrated in FIG. 15.

According to exemplary embodiments of the invention, a test clock signal is created which has a shorter cycle than that of an external clock signal. The cycle of the test clock signal is variable with data programmed in a first option circuit. This means that a dummy wordline and a dummy bitline are unnecessary for the generation of a test clock signal and there is no restriction on the cycle number of the test clock signal. A test clock control circuit may internally generate test data using the test clock signal without receiving test data externally. The generated test data may be written in a memory cell array in each cycle of the test clock signal. At least one comparator circuit may be used to check data bits, which are transferred through data lines, at one time.

Using the test clock signal that is internally generated during a half cycle of the external clock signal, read/write operations may be repeatedly performed to reduce test time. Since the cycle of the test clock signal is shorter than that of the external clock signal, the semiconductor memory device operates in synchronization with a high-frequency internal test clock signal even if an external test apparatus supplies a low-frequency clock signal. Thus, it is possible to screen disadvantages that may occur when the semiconductor memory device operates at a high frequency.

In exemplary embodiments of the present invention described above, the term "external" is used. It is intended that this term means external to the circuit or circuit element that produced the data or signal or external to the semiconductor device, for example, a semiconductor memory device of which the circuit or circuit element is a part.

In exemplary embodiments of the present invention described above, various hardware implementations have been described, however, the various features of the present invention should not be limited to these exemplary embodiments, and should also cover other implementations that would be know to one of ordinary skill in the art. Additionally, in exemplary embodiments of the present invention described above, various levels are described, for example, logical high and logical low. The various features of the present invention should not be limited to these exemplary embodiments, and should also cover other values, including complementary values, as would be know to one of ordinary skill in the art.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
    a memory cell array for storing data information;
    an address buffer circuit for receiving an external address in response to a test clock signal;
    means for generating a test period signal synchronized with an external clock signal in a test operation mode;
    means for generating a test clock signal in response to the test period signal during a half cycle of the external clock signal, the test clock signal having a shorter cycle than that of the external clock signal;
    means for generating test data in response to the test clock signal;
    means for writing the test data in an area of the memory cell array addressed by the external address in each cycle of the test clock signal;
    means for reading the test data from the area of the memory cell array in each cycle of the test clock signal and outputting the read-out data to data lines; and
    means for receiving data bits on the data lines and determining whether the data bits thereon have the same value,
    wherein the means for receiving the data bits outputs an external flag signal as a determination result.

2. The semiconductor memory device of claim 1, wherein the means for generating the test data determines whether a cycle number of the test clock signal reaches a desired cycle number and activates a clock disable signal when the cycle number of the test clock signal reaches the desired cycle number.

3. The semiconductor memory device of claim 2, wherein the generation of the test clock signal is stopped when the clock disable signal is activated.

4. The semiconductor memory device of claim 1, wherein the means for generating the test clock signal generates a reset pulse signal when the test period signal is inactivated, and the means for generating the test data is initialized by the reset pulse signal.

5. The semiconductor memory device of claim 1, wherein the means for receiving the data bits determines whether a data bit transferred through one of the data lines has the same value in each cycle of the test clock signal.

6. The semiconductor memory device of claim 5, wherein a logic state of the flag signal is determined by all determination results of the means for receiving the data bits.

7. The semiconductor memory device of claim 1, wherein the means for receiving latches one of the data bits, which is read out in an (N-1)th cycle of the external clock signal, in an Nth cycle of the external clock signal and externally outputs the latched data bit in the Nth cycle of the external clock signal.

8. A semiconductor memory device comprising:
    a memory cell array for storing data information;
    an address buffer circuit for receiving an external address in response to a test clock signal;
    a clock buffer circuit, operating in response to a wafer test flag signal, for generating a test period signal in a wafer test operation mode in response to an external clock signal;
    a test clock generation circuit for generating a test clock signal in response to the test period signal during a half period of the external clock signal, the test clock signal having a shorter period than that of the external clock signal;
    a test clock control circuit for determining whether a cycle number of the test clock signal is equal to a reference cycle number and allowing the test clock generation circuit to stop generation of the test clock signal, the test clock control circuit generating test data to be written in the memory cell array;
    a write circuit for writing the test data in an area of the memory cell array addressed by the external address in each cycle of the test clock signal;
    a read circuit for reading the test data from the area of the memory cell array in each cycle of the test clock signal and outputting the read-out test data to data lines;
    a first latch pulse generation circuit for generating first and second latch pulse signals in response to the external clock signal;
    a second latch pulse generation circuit for generating a third latch pulse signal in response to a signal on one of the data lines; and
    a comparator circuit, operating in response to the first to third latch pulse signals, for determining whether data bits on the data lines have the same value and externally outputting a flag signal as a determination result.

9. The semiconductor memory device of claim 8, wherein the test clock generation circuit generates a reset pulse signal when the test period signal is inactivated, and the test clock control circuit is reset by the reset pulse signal.

10. The semiconductor memory device of claim 8, wherein the comparator circuit determines whether a data bit on one of the data lines has the same value in each cycle of the test clock signal.

11. The semiconductor memory device of claim 10, wherein a logic state of the flag signal is decided by determination results of the comparator circuit.

12. The semiconductor memory device of claim 8, wherein the comparator circuit latches one of the data bits, which are read out in an (N-1)th cycle of the external clock signal, in an Nth cycle of the external clock signal and externally outputs the latched data bit in the Nth cycle of the external clock signal.

13. The semiconductor memory device of claim 8, further comprising a first option circuit and a second option circuit,
    wherein the first option circuit is programmed to store data for varying a clock cycle of a test clock signal outputted from the test clock generation circuit; and
    wherein the second option circuit is programmed to store data for varying the cycle number of the test clock signal determined by the test clock control circuit.

14. The semiconductor memory device of claim 8, wherein the comparator circuit includes:
- a first detector for detecting whether data bits on the data lines are identical to each another and outputting a first detection signal as a detection result;
- a second detector for detecting whether a data bit on one of the data lines has the same value in each cycle of the test clock signal and outputting a second detection signal as a detection result;
- a third detector for receiving the first and second detection signals and detecting whether one of the inputted signals indicates an error in the data bits read-out from the memory cell array in each cycle of the test clock signal; and
- an output circuit for receiving an output of the third detector in response to the first latch pulse signal and outputting the flag signal.

15. The semiconductor memory device of claim 14, wherein the comparator circuit further includes:
- a first latch, coupled between the first detector and the second detector, for latching the first detection signal in synchronization with the third latch pulse signal;
- a second latch, coupled between one of the data lines and the second detector, for latching the data bit on the one data line in response to the third latch pulse signal; and
- a third latch, coupled between the third detector and the output circuit, for latching the second detection signal in response to the second latch pulse signal.

16. The semiconductor memory device of claim 15, wherein the comparator circuit further includes a fourth latch that is coupled between the one data line and the output circuit and latches data on the one data line in synchronization with the first latch pulse signal; and
- wherein the data bit latched to the fourth latch is externally output through the output circuit when the second latch pulse signal is activated.

17. The semiconductor memory device of claim 16, wherein the fourth latch latches one of data bits, which are latched in an (N-1)th cycle of the external clock signal, in an Nth cycle of the external clock signal.

18. The semiconductor memory device of claim 8, further comprising:
- a selection signal generation circuit for generating a selection signal in response to the wafer test flag signal and a control signal; and
- a multiplexer circuit for receiving test data outputted from the test clock generation circuit and externally supplied data and selecting one of the input data in response to the selection signal,
- wherein the data selected by the multiplexer circuit is transferred to the write circuit.

19. The semiconductor memory device of claim 18, wherein the control signal is externally supplied or generated in the memory device.

20. A semiconductor memory device comprising:
- means for generating a test period signal synchronized with an external clock signal;
- means for generating a test clock signal in response to the test period signal during a half cycle of the external clock signal, the test clock signal having a shorter cycle than that of the external clock signal;
- means for generating test data in response to the test clock signal;
- means for writing the test data in an area of a memory cell array in each cycle of the test clock signal and/or reading the test data from the area of the memory cell array in each cycle of the test clock signal.

21. The semiconductor memory device of claim 20, wherein the means for generating the test data determines whether a cycle number of the test clock signal reaches a desired cycle number and activates a clock disable signal when the cycle number of the test clock signal reaches the desired cycle number.

22. The semiconductor memory device of claim 21, wherein the generation of the test clock signal is stopped when the clock disable signal is activated.

23. The semiconductor memory device of claim 20, wherein the means for generating the test clock signal generates a reset pulse signal when the test period signal is inactivated, and the means for generating the test data is initialized by the reset pulse signal.

24. A semiconductor memory device comprising:
- a clock buffer circuit, for generating a test period signal in a wafer test operation mode in response to an external clock signal;
- a test clock generation circuit for generating a test clock signal in response to the test period signal during a half period of the external clock signal, the test clock signal having a shorter period than that of the external clock signal, wherein the test clock generation circuit may stop generation of the test clock signal;
- a test clock control circuit for determining whether a cycle number of the test clock signal is equal to a reference cycle number, the test clock control circuit generating test data to be written in a memory cell array;
- a read/write circuit for writing the test data in an area of the memory cell array in each cycle of the test clock signal and/or reading the test data from the area of the memory cell array in each cycle of the test clock signal.

25. The semiconductor memory device of claim 24, wherein the test clock generation circuit generates a reset pulse signal when the test period signal is inactivated, and the test clock control circuit is reset by the reset pulse signal.

26. The semiconductor memory device of claim 24, further comprising a first option circuit and a second option circuit,
- wherein the first option circuit is programmed to store data for varying a clock cycle of a test clock signal outputted from the test clock generation circuit; and
- wherein the second option circuit is programmed to store data for varying the cycle number of the test clock signal determined by the test clock control circuit.

27. The semiconductor memory device of claim 24, further comprising:
- a selection signal generation circuit for generating a selection signal in response to the wafer test flag signal and a control signal; and
- a multiplexer circuit for receiving test data outputted from the test clock generation circuit and externally supplied data and selecting one of the input data in response to the selection signal,
- wherein the data selected by the multiplexer circuit is transferred to the read/write circuit.

28. The semiconductor memory device of claim 27, wherein the control signal is externally supplied or generated in the memory device.

* * * * *